(12) United States Patent  (10) Patent No.: US 9,268,240 B2
Sato  (45) Date of Patent: Feb. 23, 2016

(54) EXPOSURE APPARATUS, EXPOSURE METHOD, AND DEVICE FABRICATION METHOD

(71) Applicant: CANON KABUSHIKI KAISHA, Tokyo (JP)

(72) Inventor: Takanori Sato, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 186 days.

(21) Appl. No.: 14/178,391

(22) Filed: Feb. 12, 2014

(65) Prior Publication Data
US 2014/0240687 A1  Aug. 28, 2014

(30) Foreign Application Priority Data
Feb. 22, 2013 (JP) .................................. 2013-033869

(51) Int. Cl.
*G03F 7/20* (2006.01)

(52) U.S. Cl.
CPC ........ *G03F 7/70641* (2013.01); *G03F 7/70725* (2013.01)

(58) Field of Classification Search
CPC .................. G03F 7/70725; G03F 7/70641
See application file for complete search history.

(56) References Cited

U.S. PATENT DOCUMENTS

2011/0273686 A1*  11/2011  Sato .................. G03B 27/42 355/53

FOREIGN PATENT DOCUMENTS

JP  2011-238707 A  11/2011

* cited by examiner

*Primary Examiner* — Peter B Kim
*Assistant Examiner* — Michelle Iacoletti
(74) *Attorney, Agent, or Firm* — Rossi, Kimms & McDowell LLP

(57) ABSTRACT

The present invention provides an exposure apparatus which transfers a pattern of a mask to a substrate, including a measurement unit configured to measure, at a first measurement point and a second measurement point, a height of a measurement target portion in a shot region of the substrate held by a stage, and a control unit configured to move the stage in a direction of height of the substrate based on a correction result of correcting, by a set correction value, a measured height of the measurement target portion at the first measurement point in a acceleration period of the stage, and when a measured height of the measurement target portion at the second measurement point in the constant speed period of the stage deviates from an allowable range, obtain a new correction value instead of the set correction value.

9 Claims, 7 Drawing Sheets

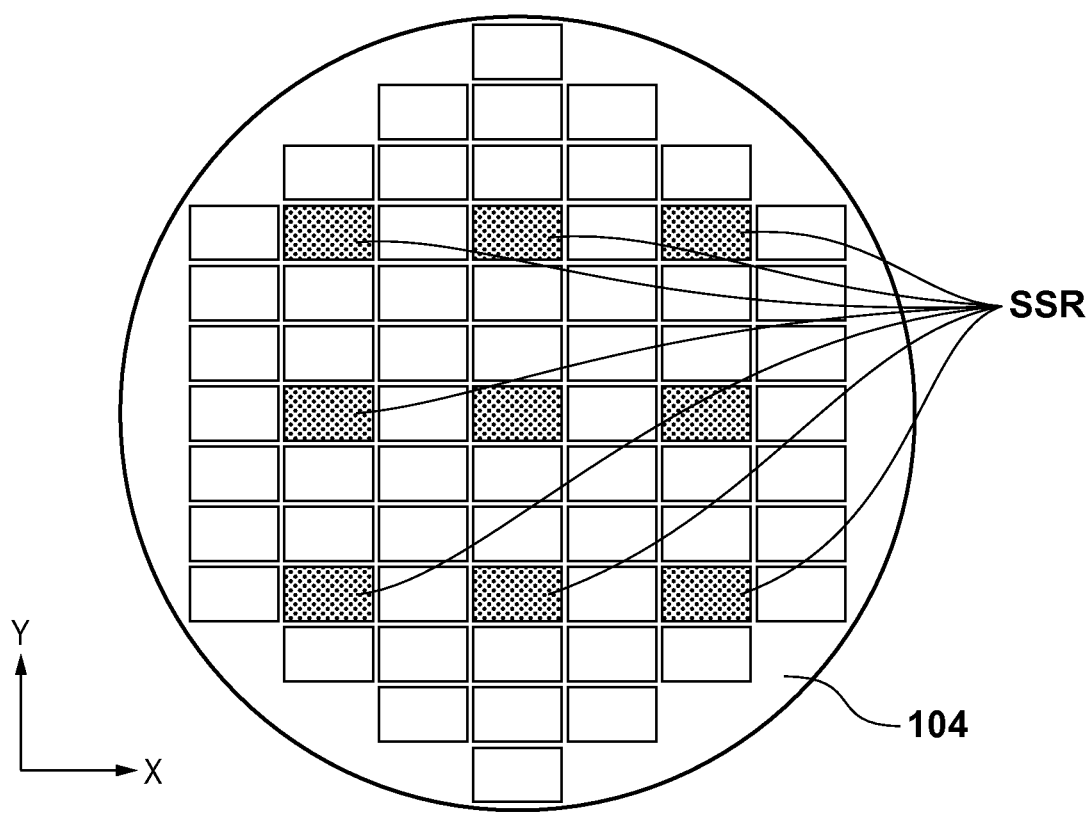
F I G. 7

EXPOSURE APPARATUS, EXPOSURE METHOD, AND DEVICE FABRICATION METHOD

BACKGROUND OF THE INVENTION

1. Field of the Invention

The present invention relates to an exposure apparatus, exposure method, and device fabrication method.

2. Description of the Related Art

When fabricating a semiconductor device or the like by using a photolithography technique, a step-and-scan exposure apparatus is used to transfer the pattern of a mask (reticle) while scanning the mask and the substrate. In order to increase the productivity in such an exposure apparatus, Japanese Patent Laid-Open No. 2011-238707 has proposed a technique of measuring the surface position (height) of a substrate held by a substrate stage while the substrate stage is accelerated (or decelerated).

However, when the surface position of a substrate is measured during acceleration of the substrate stage, the measurement result contains an error (measurement error) because the structure of the apparatus main body and the substrate stage are deformed owing to acceleration of the substrate stage. To solve this, a correction value (offset) for correcting a measurement error is obtained in advance, and a substrate is exposed while a measurement result obtained during acceleration of the substrate stage is corrected based on the correction value.

However, the measurement error changes depending on layout conditions such as the size and arrangement of the shot regions of a substrate and the exposure order of shot regions, and driving conditions such as the speed and acceleration of the substrate stage. Therefore, every time layout conditions and driving conditions are changed, the correction value for correcting a measurement error needs to be obtained.

Deformations (deformation amounts) of the structure and substrate stage change over time owing to a temperature change. The temporal changes of the deformation amounts the structure and substrate stage cause a change of the measurement error contained in the measurement result. Thus, the correction value for correcting a measurement error needs to be obtained again.

In this case, for example, when the correction value is obtained for each shot region, the same time as that of an exposure process for one substrate is required to obtain the correction value, greatly decreasing the productivity.

SUMMARY OF THE INVENTION

The present invention provides an exposure apparatus advantageous for increasing the productivity.

According to one aspect of the present invention, there is provided an exposure apparatus which transfers a pattern of a mask to a substrate while scanning the mask and the substrate, comprising: a stage configured to hold the substrate and move; a measurement unit configured to measure, at a first measurement point and a second measurement point, a height of a measurement target portion in a shot region of the substrate held by the stage; and a control unit configured to control an exposure process of exposing the substrate in an exposure region, wherein a period in which the stage is moved to expose one shot region of the substrate includes an acceleration period in which the stage is accelerated and moved while the one shot region is brought close to the exposure region, and a constant speed period, succeeding the acceleration period, in which the stage is moved at a constant speed, and the control unit moves the stage in a direction of height of the substrate based on a correction result of correcting, by a set correction value, a height of the measurement target portion that was measured by the measurement unit at the first measurement point in the acceleration period, and when a height of the measurement target portion that was measured by the measurement unit at the second measurement point in the constant speed period deviates from an allowable range, obtains a new correction value instead of the set correction value.

Further aspects of the present invention will become apparent from the following description of exemplary embodiments with reference to the attached drawings.

BRIEF DESCRIPTION OF THE DRAWINGS

FIG. 7 is a view showing an example of the array of a plurality of shot regions on a substrate.

DESCRIPTION OF THE EMBODIMENTS

Figure 1:
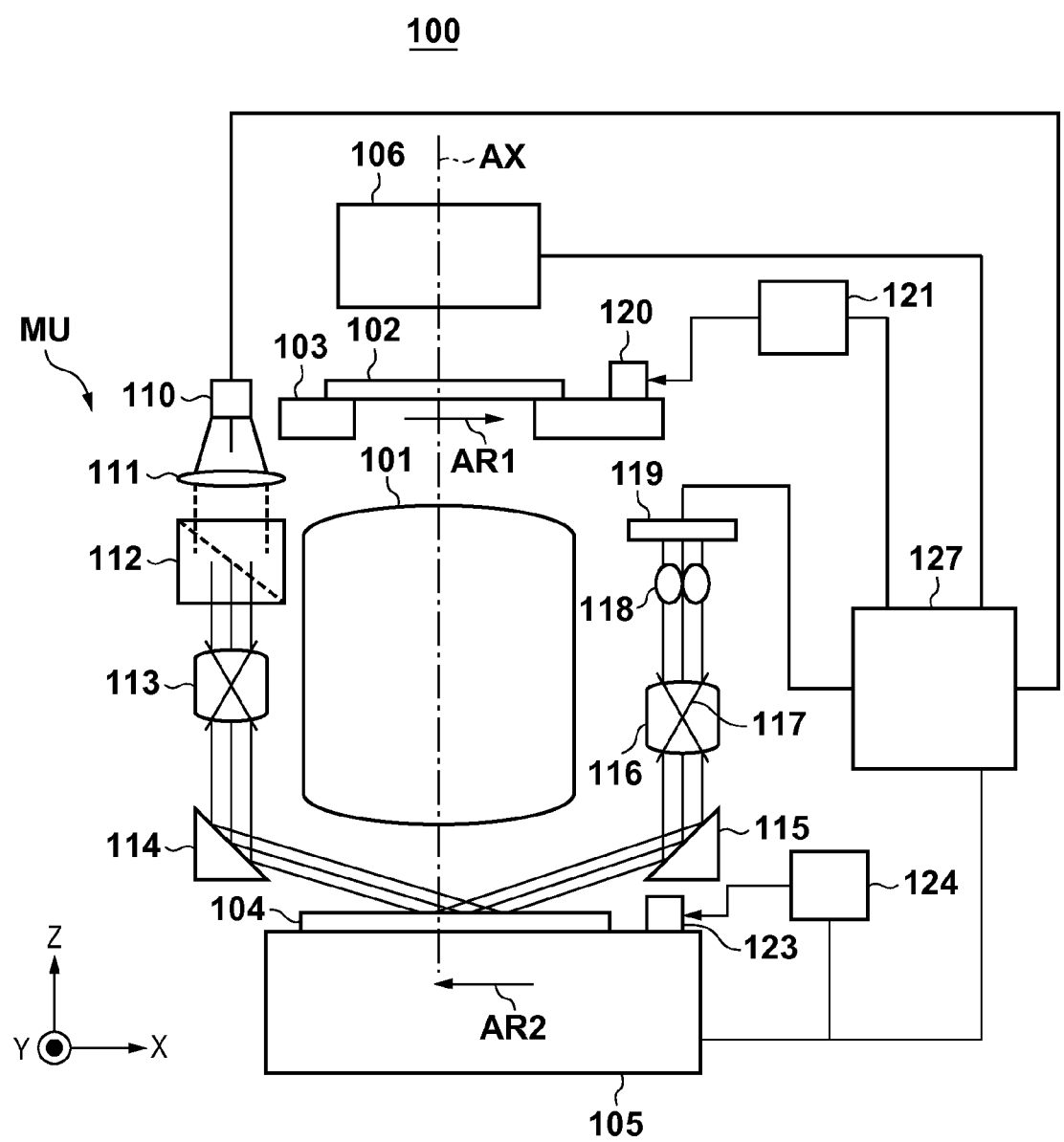
FIG. 1 is a schematic view showing the arrangement of an exposure apparatus as an aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an exposure apparatus 100 as an aspect of the present invention. The exposure apparatus 100 transfers the pattern of a mask (reticle) to a substrate while scanning the mask and the substrate. More specifically, the exposure apparatus 100 is a scanning exposure apparatus (scanner) which uses an exposure region of a rectangular or arc slit shape and performs exposure at a large angle of view with high accuracy by relatively scanning the mask and substrate at a high speed. As shown in FIG. 1, the exposure apparatus 100 includes a projection optical system 101, mask stage 103, substrate stage 105, illumination optical system 106, main control unit 127, and measurement unit MU.

In FIG. 1, AX is the optical axis of the projection optical system 101, and the imaging plane of the projection optical system 101 is perpendicular to the Z-axis direction. The mask stage 103 holds a mask 102. The pattern of the mask 102 is projected at the magnification (for example, ¼, ½, or ⅕) of the projection optical system 101, forming an image on the imaging plane (imaging plane of the pattern).

A substrate 104 is, for example, a wafer whose surface is coated with a resist (photosensitive agent). A plurality of shot regions having the same pattern structure formed by the preceding exposure process are arrayed on the substrate 104. The substrate stage 105 is a stage which holds the substrate 104 and moves, and includes a chuck for chucking (fixing) the substrate 104. The substrate stage 105 also includes an X-Y stage which is horizontally movable in the X- and Y-axis directions, and can move in the Z-axis direction (direction of height of the substrate 104) parallel to the optical axis AX of the projection optical system 101. The substrate stage 105 also includes a leveling stage rotatable about the X- and Y-axes, and a rotation stage rotatable about the Z-axis. The substrate stage 105 therefore constructs a six-axis driving system for making the pattern image of the mask 102 coincide with the shot region of the substrate 104. Positions of the substrate stage 105 in the X-, Y-, and Z-axis directions are always measured by a bar mirror 123 arranged on the substrate stage 105 and an interferometer 124.

The measurement unit MU has a function of measuring the surface position (height) and tilt of the substrate 104. In the embodiment, the measurement unit MU measures the height of a measurement target portion in the shot region of the substrate 104 held by the substrate stage 105 at a plurality of measurement points. The measurement unit MU includes a light source 110, collimator lens 111, slit member 112, light projecting side optical system 113, light projecting side mirror 114, light receiving side mirror 115, light receiving side optical system 116, stopper diaphragm 117, correction optical system 118, and photoelectric converter 119.

The light source 110 includes a lamp, light emitting diode, or the like. The collimator lens 111 converts light emitted by the light source 110 into parallel light whose section has an almost uniform intensity distribution. The slit member 112 is constructed by bonding a pair of prisms (prism-shaped members) so that their inclined surfaces face each other. A plurality of openings (15 pinholes in the embodiment) are formed in the bonded surface by using a light shielding film made of chrome or the like. The light projecting side optical system 113 is a bi-telecentric system, and guides beams having passed through the 15 pinholes of the slit member 112 to the substrate 104 (more specifically, 15 measurement target portions of the shot region) via the light projecting side mirror 114.

A plane (bonded surface) on which the pinholes are formed, and a plane including the surface of the substrate 104 are set to satisfy a shine proof condition with respect to the light projecting side optical system 113. In the embodiment, an incident angle (angle defined by the optical axis AX) φ of light from the light projecting side optical system 113 to the substrate 104 is 70° or more. The 15 beams having passed through the light projecting side optical system 113 enter independent measurement target portions on the substrate and form images. Light from the light projecting side optical system 113 enters the substrate from a direction which is rotated by θ° (for example, 22.5°) on the X-Y plane from the X-axis direction so that 15 measurement target portions on the substrate can be observed independently.

The light receiving side optical system 116 is a bi-telecentric system. The 15 beams (reflected beams) reflected by the substrate 104 (respective measurement target portions) enter the light receiving side optical system 116 via the light receiving side mirror 115. The stopper diaphragm 117 is arranged in the light receiving side optical system 116 and is set commonly to the 15 measurement target portions. The stopper diaphragm 117 cuts off high-order diffracted light (noise light) generated by a pattern formed on the substrate 104.

The optical axes of the beams having passed through the light receiving side optical system 116 are parallel to each other. The correction optical system 118 includes 15 correction lenses, and forms the 15 beams having passed through the light receiving side optical system 116 into spot beams having the same size on the photoelectric conversion surface (light receiving surface) of the photoelectric converter 119. In the embodiment, the light receiving side optical system 116, stopper diaphragm 117, and correction optical system 118 perform inclination correction so that each measurement target portion on the substrate and the photoelectric conversion surface of the photoelectric converter 119 become conjugate to each other. Thus, a change of the position of a pinhole image on the photoelectric conversion surface does not arise from local tilt of each measurement target portion on the substrate. The pinhole image on the photoelectric conversion surface changes in accordance with a change of the height of each measurement target portion in a direction parallel to the optical axis AX. The photoelectric converter 119 is constructed by, for example, 15 one-dimensional CCD line sensors. However, a plurality of two-dimensional sensors may be arranged instead.

As described above, the mask stage 103 holds the mask 102. The mask stage 103 is scanned at a constant speed in the X-axis direction (direction indicated by an arrow AR1) in a plane perpendicular to the optical axis AX of the projection optical system 101. At this time, the mask stage 103 is scanned so that a position of the mask stage 103 in the Y-axis direction always maintains a target position (correction driving). Positions of the mask stage 103 in the X- and Y-axis directions are always measured by a bar mirror 120 arranged on the mask stage 103 and an interferometer 121.

The illumination optical system 106 illuminates the mask 102 by using light from a light source which generates pulsed light, such as an excimer laser. The illumination optical system 106 includes a beam shaping optical system, optical integrator, collimator lens, mirror, and masking blade. The illumination optical system 106 efficiently transmits or reflects pulsed light in the far-ultraviolet region. The beam shaping optical system forms the sectional shape (dimensions) of incident light into a predetermined shape. The optical integrator uniforms the light distribution characteristic and illuminates the mask 102 at a uniform illuminance. The masking blade defines a rectangular illumination region corresponding to a chip size. The pattern of the mask 102 partially illuminated in this illumination region is projected to the substrate 104 via the projection optical system 101.

The main control unit 127 includes a CPU and memory, and controls the overall exposure apparatus 100 (exposure process of exposing the substrate 104). The period in which the substrate stage 105 is moved to expose one shot region of the substrate 104 includes the acceleration period and constant speed period. The acceleration period is a period in which the substrate stage 105 is accelerated and moved while one shot region is brought close to the exposure region. The constant speed period is a period, succeeding the acceleration period, in which the substrate stage 105 is moved at a constant speed. Assume that acceleration of the substrate stage 105 includes even deceleration of the substrate stage 105 (that is, a negative acceleration).

The main control unit 127 controls the mask stage 103 which holds the mask 102, and the substrate stage 105 which holds the substrate 104, in order to form light reflecting the pattern of the mask 102 into an image in a predetermined region of the substrate 104. For example, the main control unit 127 adjusts, via the mask stage 103 and substrate stage 105, the positions of the mask 102 and substrate 104 in the X-Y plane (positions in the X- and Y-axis directions and rotation about the Z-axis), and their positions in the Z-axis direction (rotations about the X- and Y-axes). The main control unit 127 scans the mask stage 103 and substrate stage 105 in synchronism with the projection optical system 101.

When the mask stage 103 is scanned in the direction indicated by the arrow AR1, the substrate stage 105 is scanned in a direction indicated by an arrow AR2 at a speed corrected by the magnification (reduction magnification) of the projection optical system 101. The scanning speed of the mask stage 103 is determined to be advantageous for the productivity, based on the width of the masking blade in the scanning direction in the illumination optical system 106, and the sensitivity of a resist applied to the surface of the substrate 104.

The pattern of the mask 102 is aligned in the X-Y plane based on the positions of the mask stage 103, substrate stage 105, and substrate 104. As described above, the positions of the mask stage 103 and substrate stage 105 are measured by the interferometers 121 and 124, respectively. The position of the substrate 104 is obtained from an alignment optical system (not shown).

Alignment of the pattern of the mask 102 in the Z-axis direction, that is, alignment to the imaging plane of the projection optical system 101 is implemented by controlling (the leveling stage included in) the substrate stage 105 based on the measurement result of the measurement unit MU.

The main control unit 127 controls the substrate stage 105 based on a correction result of correcting, by a set correction value, the height of a measurement target portion in the shot region of the substrate 104 that was measured by the measurement unit MU at the first measurement point in the acceleration period of the substrate stage 105, which will be described later. More specifically, the main control unit 127 moves the substrate stage 105 in the direction of height of the substrate 104 based on the correction result. At this time, the substrate stage 105 is preferably moved before the end of the acceleration period. If the height of the measurement target portion that was measured by the measurement unit MU at the second measurement point in the constant speed period of the substrate stage 105 deviates from an allowable range, the main control unit 127 obtains a new correction value instead of the set correction value.

Figure 2:
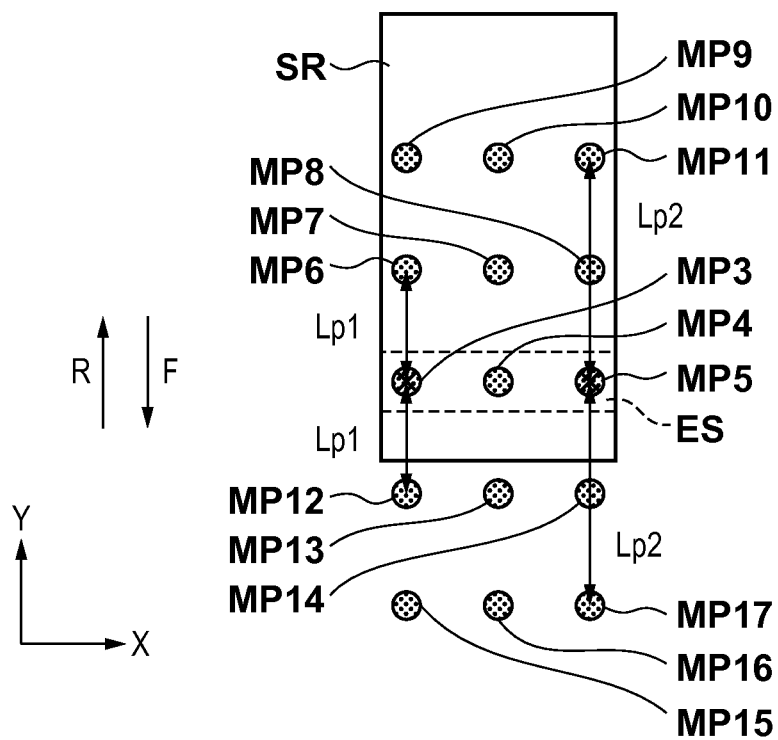
FIG. 2 is a view showing the relationship between measurement points formed in the shot region of a substrate by the measurement unit of the exposure apparatus shown in FIG. 1, and an exposure slit (exposure region).

FIG. 2 is a view showing the relationship between measurement points MP3 to MP17 formed in a shot region SR of the substrate 104 by the measurement unit MU, and an exposure slit (exposure region) ES. The exposure slit ES is a rectangular region indicated by a broken line in FIG. 2. The measurement points MP3, MP4, and MP5 are measurement points formed in the exposure slit ES. The measurement points MP6, MP7, and MP8 and the measurement points MP12, MP13, and MP14 are measurement points formed at positions spaced apart by a distance Lp1 from the exposure slit ES. The measurement points MP9, MP10, and MP11 and the measurement points MP15, MP16, and MP17 are measurement points formed at positions spaced apart by a distance Lp2 from the exposure slit ES. The distances Lp1 and Lp2 have a relation of Lp1<Lp2.

The main control unit 127 can control the measurement timings of the measurement points MP3 to MP17 by the measurement unit MU based on the distances between the exposure slit ES and the respective measurement points MP3 to MP17, and the scanning direction and scanning speed of the substrate stage 105. The measurement points MP3, MP6, MP9, MP12, and MP15 are formed at the same X-coordinate position. The measurement points MP4, MP7, MP10, MP13, and MP16 are formed at the same X-coordinate position. Further, the measurement points MP5, MP8, MP11, MP14, and MP17 are formed at the same X-coordinate position. For example, when the substrate stage 105 is scanned in the Y-axis direction, the same coordinate position of the shot region SR can be measured at different measurement points by adjusting the measurement timings of the measurement points MP3 to MP17.

Figure 3A:
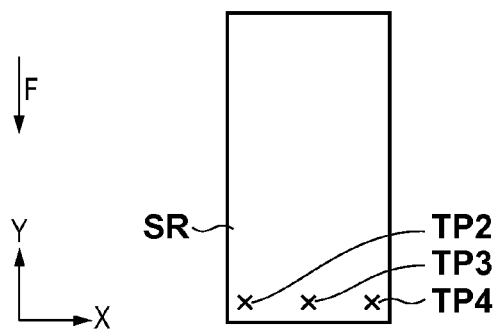
FIGS. 3A to 3D are views for explaining measurement of the height of a measurement target portion in a shot region by the measurement unit of the exposure apparatus shown in FIG. 1.
Figure 3B:
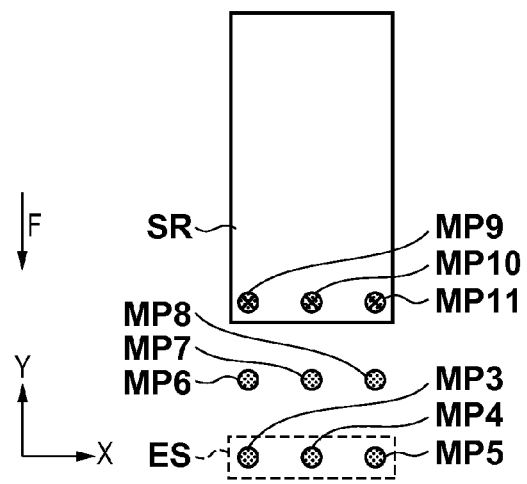
Figure 3C:
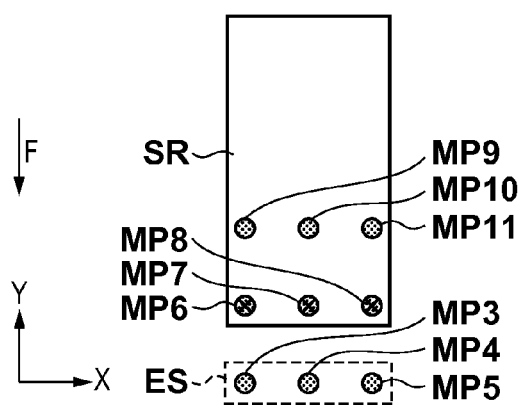
Figure 3D:
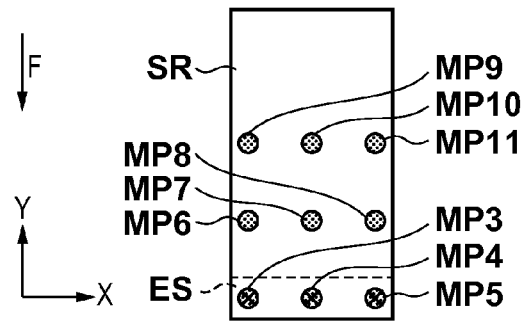

Measurement of the height of a measurement target portion in the shot region SR by the measurement unit MU will be explained with reference to FIGS. 3A to 3D. In FIG. 3A, TP2, TP3, and TP4 are measurement target portions in the shot region SR. There are a plurality of measurement target portions in the shot region SR in the Y-axis direction in order to measure the height of the entire shot region SR. However, FIG. 3A shows only the measurement target portions TP2, TP3, and TP4 for simplicity.

For example, a case in which the height of the measurement target portion TP2 in the shot region SR is measured by scanning the substrate stage 105 in a direction indicated by an arrow F, as shown in FIG. 3A, will be examined. In a state shown in FIG. 3B, the main control unit 127 controls the measurement timing so that the measurement unit MU measures the height of the measurement target portion TP2 at the measurement point MP9. In a state shown in FIG. 3C upon the lapse of a predetermined time, the main control unit 127 controls the measurement timing so that the measurement unit MU measures the measurement target portion TP2 at the measurement point MP6. Further, in a state shown in FIG. 3D upon the lapse of a predetermined time, the main control unit 127 controls the measurement timing so that the measurement unit MU measures the measurement target portion TP2 at the measurement point MP3.

Similarly, a case in which the height of the measurement target portion TP3 in the shot region SR is measured by scanning the substrate stage 105 in the direction indicated by the arrow F will be examined. In the state shown in FIG. 3B, the main control unit 127 controls the measurement timing so that the measurement unit MU measures the height of the measurement target portion TP3 at the measurement point MP10. In the state shown in FIG. 3C upon the lapse of a predetermined time, the main control unit 127 controls the measurement timing so that the measurement unit MU measures the measurement target portion TP3 at the measurement point MP7. Further, in the state shown in FIG. 3D upon the lapse of a predetermined time, the main control unit 127 controls the measurement timing so that the measurement unit MU measures the measurement target portion TP3 at the measurement point MP4.

Similarly, a case in which the height of the measurement target portion TP4 in the shot region SR is measured by scanning the substrate stage 105 in the direction indicated by the arrow F will be examined. In the state shown in FIG. 3B, the main control unit 127 controls the measurement timing so that the measurement unit MU measures the height of the measurement target portion TP4 at the measurement point MP11. In the state shown in FIG. 3C upon the lapse of a predetermined time, the main control unit 127 controls the measurement timing so that the measurement unit MU measures the measurement target portion TP4 at the measurement point MP8. Further, in the state shown in FIG. 3D upon the lapse of a predetermined time, the main control unit 127 controls the measurement timing so that the measurement unit MU measures the measurement target portion TP4 at the measurement point MP5.

In accordance with a direction (moving direction) in which the substrate stage 105 is scanned, the main control unit 127 switches the measurement point to be used to measure the height of a measurement target portion in the shot region SR. For example, referring to FIG. 2, when the substrate stage 105 is scanned in the direction indicated by an arrow F, the heights of measurement target portions in the shot region SR are measured at the measurement points MP6 to MP11. In contrast, when the substrate stage 105 is scanned in a direction indicated by an arrow R, the heights of measurement target portions in the shot region SR are measured at the measurement points MP12 to MP17. Based on these measurement results, the main control unit 127 calculates the height (position in the Z-axis direction) of an exposure target region including the measurement target portions in the shot region SR. The main control unit 127 moves the substrate stage 105 in the Z-axis direction (direction of height of the substrate 104) so that the exposure target region is located at an optimum exposure position (imaging plane of the pattern of the mask 102) until the exposure target region reaches the exposure slit ES.

Figure 4A:
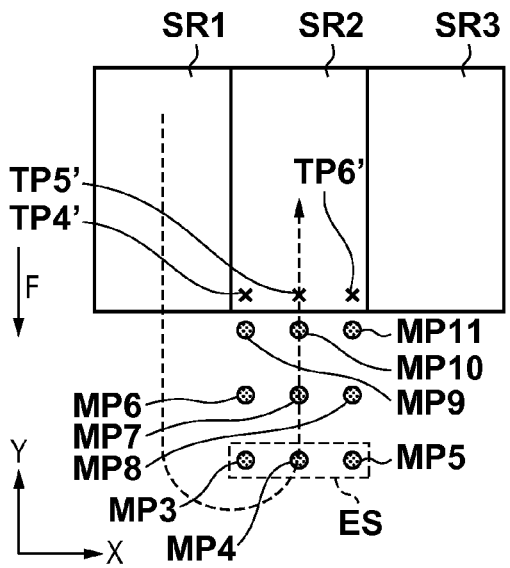
FIGS. 4A to 4D are views for explaining in detail measurement of the height of a measurement target portion in a shot region in an exposure process of exposing the substrate in the exposure apparatus shown in FIG. 1.
Figure 4B:
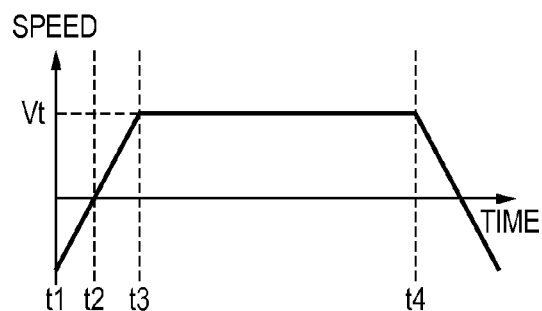
Figure 4C:
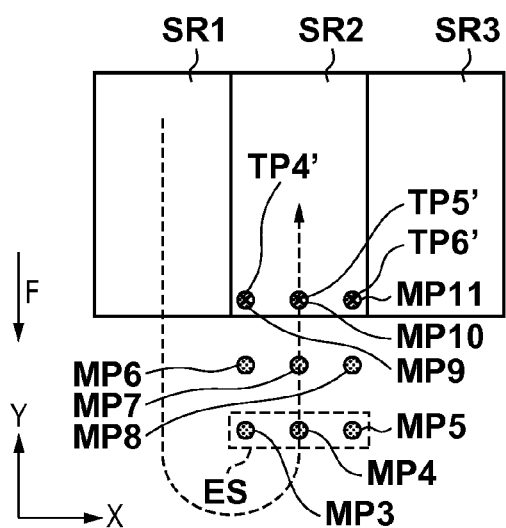
Figure 4D:
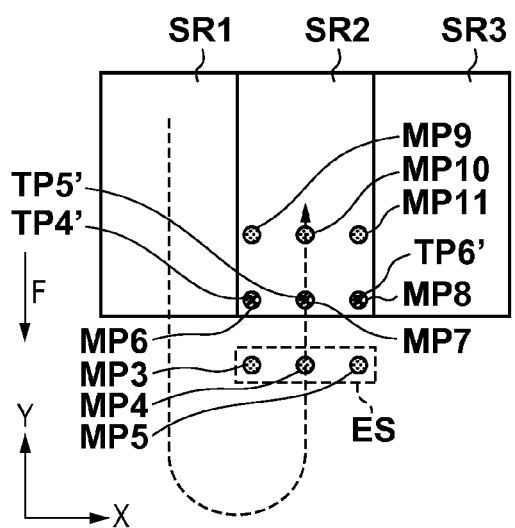

Measurement of the height of a measurement target portion in the shot region in an exposure process of exposing the substrate 104 will be explained in detail with reference to FIGS. 4A to 4D. FIGS. 4A, 4C, and 4D are views showing the exposure slit ES, the measurement points MP3 to MP11, shot regions SR1, SR2, and SR3, measurement target portions TP4', TP5', and TP6', and the trajectory of the substrate stage 105. There are a plurality of measurement target portions in the shot region SR2 in the Y-axis direction in order to measure the height of the entire shot region SR2. However, FIGS. 4A, 4C, and 4D show only the measurement target portions TP4', TP5', and TP6' for simplicity. In FIGS. 4A, 4C, and 4D, the shot region SR1 is a shot region having undergone the exposure process. The shot region SR2 is a shot region to undergo the exposure process next to the shot region SR1. The shot region SR3 is a shot region to undergo the exposure process next to the shot region SR2. In FIGS. 4A, 4C, and 4D, an arrow indicated by a broken line represents the trajectory of the substrate stage 105. FIG. 4B is a timing chart showing the relationship between the speed (scanning speed) of the substrate stage 105 and the time when the substrate stage 105 is moved along the trajectory shown in FIGS. 4A, 4C, and 4D.

After the end of the exposure process for the shot region SR1, the substrate stage 105 moves in the X-axis direction while decelerating in the Y-axis direction, and moves to the shot region SR2 to undergo the exposure process next. This period (deceleration period) corresponds to a period from time t1 to time t2 shown in FIG. 4B.

When the substrate stage 105 reaches the acceleration start point in the Y-axis direction (that is, movement in the X-axis direction ends), it is accelerated and moved in a direction indicated by an arrow F. This period (acceleration period) corresponds to a period from time t2 to time t3 shown in FIG. 4B.

As shown in FIG. 4C, when the measurement points MP9 to MP11 reach the measurement target portions TP4' to TP6' in the shot region SR2, the heights of the measurement target portions TP4' to TP6' are measured at the measurement points MP9 to MP11. At this time, the heights of the measurement target portions TP4' to TP6' are measured in the acceleration period of the substrate stage 105, so the measurement result contains a measurement error, as described above. Thus, the main control unit 127 obtains (sets) in advance a correction value for correcting a measurement error by the technique disclosed in Japanese Patent Laid-Open No. 2011-238707 or the like, and corrects the measurement result based on this correction value (that is, removes the measurement error contained in the measurement result). Based on the result (correction result) of correcting the measurement result based on the correction value, the main control unit 127 starts control of (the leveling stage included in) the substrate stage 105 so that the exposure target region is located at the optimum exposure position. More specifically, the main control unit 127 starts control of the substrate stage 105 so that a position of the substrate stage 105 in the Z-axis direction comes to the optimum exposure position when the exposure slit ES reaches an exposure target region including the measurement target portions TP4' to TP6'.

When the speed (scanning speed) of the substrate stage 105 becomes a target speed, the substrate stage 105 keeps moving at a constant speed until the exposure slit ES passes through the shot region SR2. This period (constant speed period) corresponds to a period from time t3 to time t4 shown in FIG. 4B.

As shown in FIG. 4D, when the measurement points MP6 to MP8 reach the measurement target portions TP4' to TP6' in the shot region SR2, the heights of the measurement target portions TP4' to TP6' are measured at the measurement points MP6 to MP8. At this time, the heights of the measurement target portions TP4' to TP6' are measured in the constant speed period of the substrate stage 105, so the measurement result does not contain a measurement error. Therefore, while sequentially measuring the heights of measurement target portions (not shown) in the shot region SR2, the main control unit 127 controls the substrate stage 105 based on the measurement result so that the exposure target region is located at the optimum exposure position. When the exposure slit ES reaches the shot region SR2, the main control unit 127 starts exposure, and performs the exposure process for the shot region SR2 while repeating measurement of the heights of measurement target portions and control of the substrate stage 105.

When the exposure slit ES passes through the shot region SR2 (that is, the exposure process for the shot region SR2 ends), the main control unit 127 starts a process for exposing the shot region SR3. More specifically, the main control unit 127 moves the substrate stage 105 in the X-axis direction while decelerating it in the Y-axis direction, then moves it to the shot region SR3 to undergo the exposure process next, and accelerates it in the Y-axis direction. This period corresponds to a period after time t4 shown in FIG. 4B.

Figure 5A:
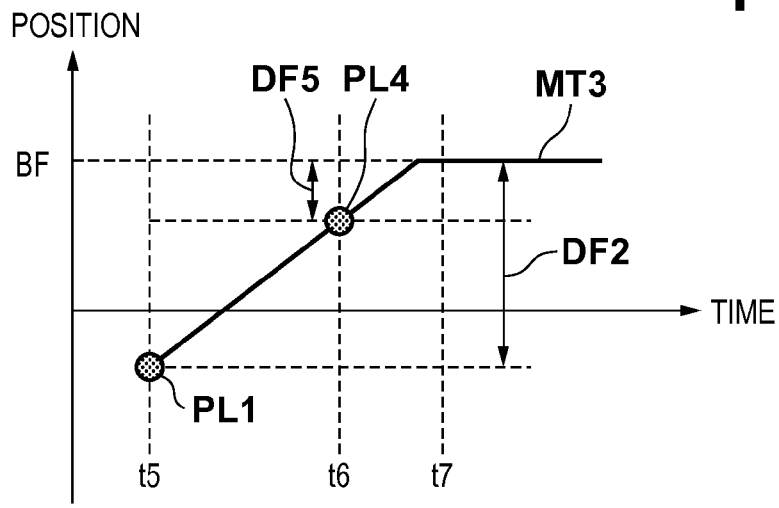
FIGS. 5A to 5C are charts for explaining control of a substrate stage based on the measurement result of the measurement unit in the exposure apparatus shown in FIG. 1.
Figure 5B:
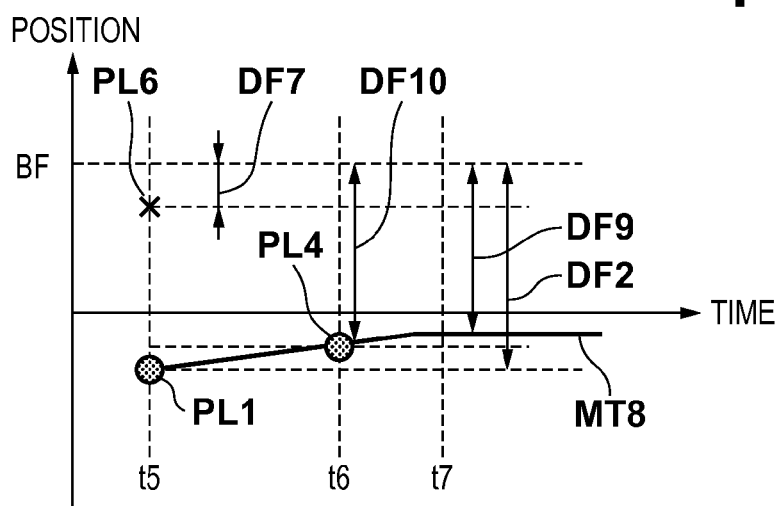
Figure 5C:
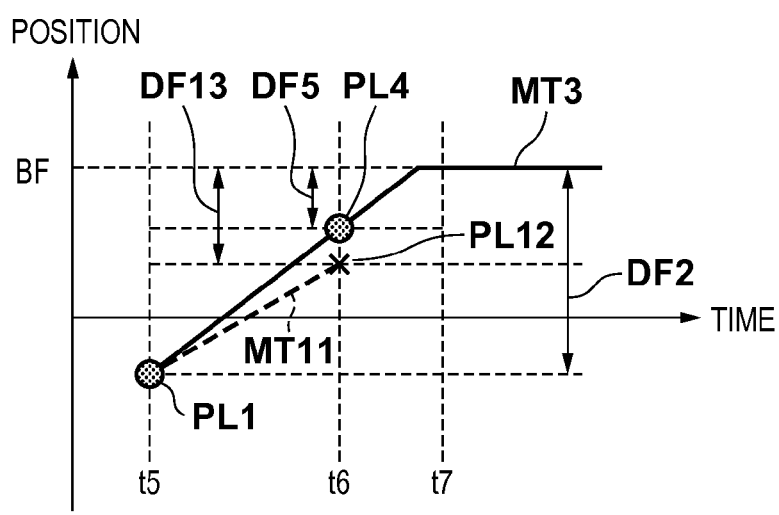

Control of the substrate stage 105 based on the measurement result of the measurement unit MU will be explained with reference to FIGS. 5A to 5C. A case in which the substrate stage 105 is controlled so that a region including the measurement target portions TP4' to TP6' in the shot region SR2 shown in FIGS. 4A, 4C, and 4D is located at an optimum exposure position. In FIGS. 5A to 5C, the ordinate represents a position of the substrate stage 105 in the Z-axis direction, and the abscissa represents the time. BF is an optimum exposure position.

In FIGS. 5A to 5C, time t5 is the time when the state shown in FIG. 4C is obtained. In other words, time t5 is the time when the heights of the measurement target portions TP4' to TP6' in the shot region SR2 are measured at the measurement points MP9 to MP11 in the acceleration period of the substrate stage 105. Time t6 is the time when the state shown in FIG. 4D is obtained. In other words, time t6 is the time when the heights of the measurement target portions TP4' to TP6' in the shot region SR2 are measured at the measurement points MP6 to MP8 in the constant speed period of the substrate stage 105. Time t7 is the time when the exposure slit ES reaches the shot region SR2.

Referring to FIG. 5A, PL1 is a correction result of correcting, based on a correction value for correcting a measurement error, the result of measuring each of the heights of the measurement target portions TP4' to TP6' in the shot region SR2 at the measurement points MP9 to MP11 at time t5. A difference DF2 between the correction result PL1 and the optimum exposure position BF corresponds to the moving amount of the substrate stage 105 in the Z-axis direction that is necessary to locate, at the optimum exposure position, the region including the measurement target portions TP4' to TP6' in the shot region SR2. MT3 is the trajectory of the substrate stage 105 that is generated by the main control unit 127 based on the difference DF2 between the correction result PL1 and the optimum exposure position BF. The main control unit 127 generates the trajectory MT3 of the substrate stage 105 so that the substrate stage 105 is located at the optimum exposure position BF at time t7.

Referring to FIG. 5B, PL6 is a correction result of correcting, based on a correction value for correcting a measurement error, the result of measuring each of the heights of the measurement target portions TP4' to TP6' in the shot region SR2 at the measurement points MP9 to MP11 at time t5. Unlike the correction result PL1, the correction result PL6 exhibits a case in which the correction value is improper. The correction value becomes improper when, for example, the speed (scanning speed) of the substrate stage 105 is different between the time when this correction value is obtained, and time t5. In FIG. 5B, the difference between the correction result PL6 and the optimum exposure position BF is DF7, and the trajectory of the substrate stage 105 is MT8. Therefore, defocus is generated by a difference DF9 between the difference DF7 obtained when the correction value is improper (FIG. 5B) and the difference DF2 obtained when the correction value is proper (FIG. 5A). This causes a resolution error of the pattern of the mask 102.

As described above, at time t6, the heights of the measurement target portions TP4' to TP6' can be measured in the constant speed period of the substrate stage 105, so a measurement result PL4 does not contain a measurement error. At time t6, a difference DF10 between the measurement result PL4 of the heights of the measurement target portions TP4' to TP6' and the optimum exposure position BF can be obtained without the influence of a measurement error.

In the embodiment, the validity (whether the correction value is proper or improper) of the correction value at time t5 is determined using the difference DF10 between the measurement result PL4 obtained in the constant speed period of the substrate stage 105 and the optimum exposure position BF. In other words, it is determined whether the measurement result PL4 obtained in the constant speed period of the substrate stage 105 deviates from the allowable range. More specifically, the main control unit 127 calculates the difference DF10 between the measurement result PL4 of the heights of the measurement target portions TP4' to TP6' at time t6 and the optimum exposure position BF. If the difference DF10 between the measurement result PL4 and the optimum exposure position BF does not exceed a predetermined threshold, the main control unit 127 determines that the correction value at time t5 is proper. If the difference DF10 between the measurement result PL4 and the optimum exposure position BF exceeds the predetermined threshold, the main control unit 127 determines that the correction value at time t5 is improper. The main control unit 127 stops exposure of a shot region where the difference DF10 between the measurement result PL4 and the optimum exposure position BF exceeds the predetermined threshold, and obtains a new correction value instead of the correction value determined to be improper, by the technique disclosed in Japanese Patent Laid-Open No. 2011-238707 or the like.

According to the embodiment, before the exposure target region of the shot region reaches the exposure slit ES, the validity of the correction value can be determined, and thus generation of a resolution error of the pattern of the mask 102 caused by defocus can be prevented. Since the validity of the correction value can be determined between exposure processes, the correction value need not be periodically obtained, and the productivity of the exposure apparatus 100 can be increased. Further, the validity of the correction value can be determined for each shot region of the substrate 104. It therefore suffices to obtain a new correction value for only a shot region for which the correction value is improper. The productivity of the exposure apparatus 100 can be increased.

A case in which a foreign substance exists at the measurement target portions TP4' to TP6' in the shot region SR2 will be examined. In this case, even if the correction value at time t5 is proper, the moving amount of the substrate stage 105 in the Z-axis direction when controlling the substrate stage 105 based on the correction result PL1 increases. If the moving amount of the substrate stage 105 in the Z-axis direction increases, the difference between the measurement result PL4 at time t6 and the optimum exposure position BF increases. Owing to the influence of the foreign substance present at the measurement target portions TP4' to TP6', it may be erroneously determined that the correction value at time t5 is improper. To prevent this, an abnormal value (abnormal measurement result) generated by the influence of a foreign substance or the like is removed from the measurement results of the heights of the measurement target portions TP4' to TP6'. For example, an approximation curve is obtained from the measurement results of the heights of the measurement target portions TP4' to TP6'. If a value greatly deviates from the approximation curve, it is determined as an abnormal value and removed. More specifically, first, an approximation curve is calculated by the least squares method based on the measurement results of the heights of the measurement target portions TP4' to TP6' measured at the measurement points MP9 to MP11. Then, the difference between the calculated approximation curve and the measurement result of each of the measurement points MP9 to MP11 is obtained. If this difference exceeds a predetermined threshold, the measurement result is determined as an abnormal value and removed.

A case in which the flatness of the shot region SR2 is poorer than those of the remaining shot regions will be examined. In this case, even if the correction value at time t5 is proper, the moving amount of the substrate stage 105 in the Z-axis direction when controlling the substrate stage 105 based on the correction result PL1 increases. If the moving amount of the substrate stage 105 in the Z-axis direction increases, a difference is generated between a trajectory of the substrate stage 105 that is generated by the main control unit 127, and an actual trajectory MT11 of the substrate stage 105, as shown in FIG. 5C. Referring to FIG. 5C, DF5 is the difference between the measurement result PL4 at time t6 and the optimum exposure position BF when the substrate stage 105 moves along the trajectory MT3. DF13 is the difference between a measurement result PL12 at time t6 and the optimum exposure position BF when the substrate stage 105 moves along the actual trajectory MT11. The difference between the differences DF5 and DF13 shown in FIG. 5C corresponds to the control deviation (movement deviation) of the substrate stage 105. Owing to the influence of the control deviation of the substrate stage 105, it may be erroneously determined that the correction value at time t5 is improper. It is therefore necessary to remove the control deviation of the substrate stage 105 from the measurement results of the heights of the measurement target portions TP4' to TP6'. Note that the control deviation of the substrate stage 105 can be calculated from a position of the substrate stage 105 in the Z-axis direction based on the trajectory MT3 of the substrate stage 105 that is generated by the main control unit 127, and a position of the substrate stage 105 that is measured by the interferometer 124.

To increase the control accuracy of the substrate stage 105, the main control unit 127 sometimes changes the trajectory generation method of the substrate stage 105 for each shot region. For example, the trajectory of the substrate stage 105 is changed to be a nonlinear shape such as a cosine wave, or a filter such as a low-pass filter is applied to the trajectory of the substrate stage 105. Depending on the trajectory generation method of the substrate stage 105, the measurement results of the heights of the measurement target portions TP4' to TP6' at time t6 change. In this case, it is preferable to remove a change of the measurement result arising from the difference in the trajectory generation method of the substrate stage 105. For example, before performing the exposure process for the substrate 104, the measurement results of the heights of the measurement target portions TP4' to TP6' at time t6 are obtained for each trajectory generation method of the substrate stage 105. More specifically, the differences of the measurement results of the measurement target portions TP4' to TP6' are obtained as offsets by using, as a reference, a generation method most frequently used in the exposure process. In accordance with a generation method actually used in the exposure process, the measurement results of the heights of the measurement target portions TP4' to TP6' are corrected based on the offsets.

The threshold for determining the validity of the correction value is determined based on, for example, at least one of the speed (scanning speed) of the substrate stage 105 in the constant speed period or the depth of focus of the substrate 104 held by the substrate stage 105. More specifically, the relationship between the difference between the measurement result PL4 at time t6 and the optimum exposure position BF, and the defocus amount of the exposure result is obtained in advance. Then, an allowable defocus amount is determined from the depth of focus of the substrate 104, and the threshold is determined based on the defocus amount.

The movable amount of the substrate stage 105 in the Z-axis direction in the period from time t6 to time t7 shown in FIGS. 5A to 5C changes depending on the time from time t6 to time t7. The time from time t6 to time t7 depends on the distance between the measurement points MP6 to MP8 and the exposure slit ES, and the speed of the substrate stage 105. The distance between the measurement points MP6 to MP8 and the exposure slit ES has a fixed value because the positional relationship between the measurement points MP6 to MP8 and the exposure slit ES is constant. In contrast, the speed of the substrate stage 105 changes depending on the sensitivity of a resist applied to the surface of the substrate 104, or the like. In other words, the movable amount of the substrate stage 105 in the Z-axis direction in the period from time t6 to time t7 changes depending on the speed of the substrate stage 105. For example, when the speed of the substrate stage 105 is low, the movable amount of the substrate stage 105 in the Z-axis direction in the period from time t6 to time t7 becomes larger than that when the speed of the substrate stage 105 is high. In other words, even when the difference between the measurement result PL4 at time t6 and the optimum exposure position BF is large, if the speed of the substrate stage 105 is low, the substrate stage 105 can be moved to the optimum exposure position BF at time t7. For this reason, the threshold for determining the validity of the correction value may be determined based on the speed of the substrate stage 105.

Figure 6:
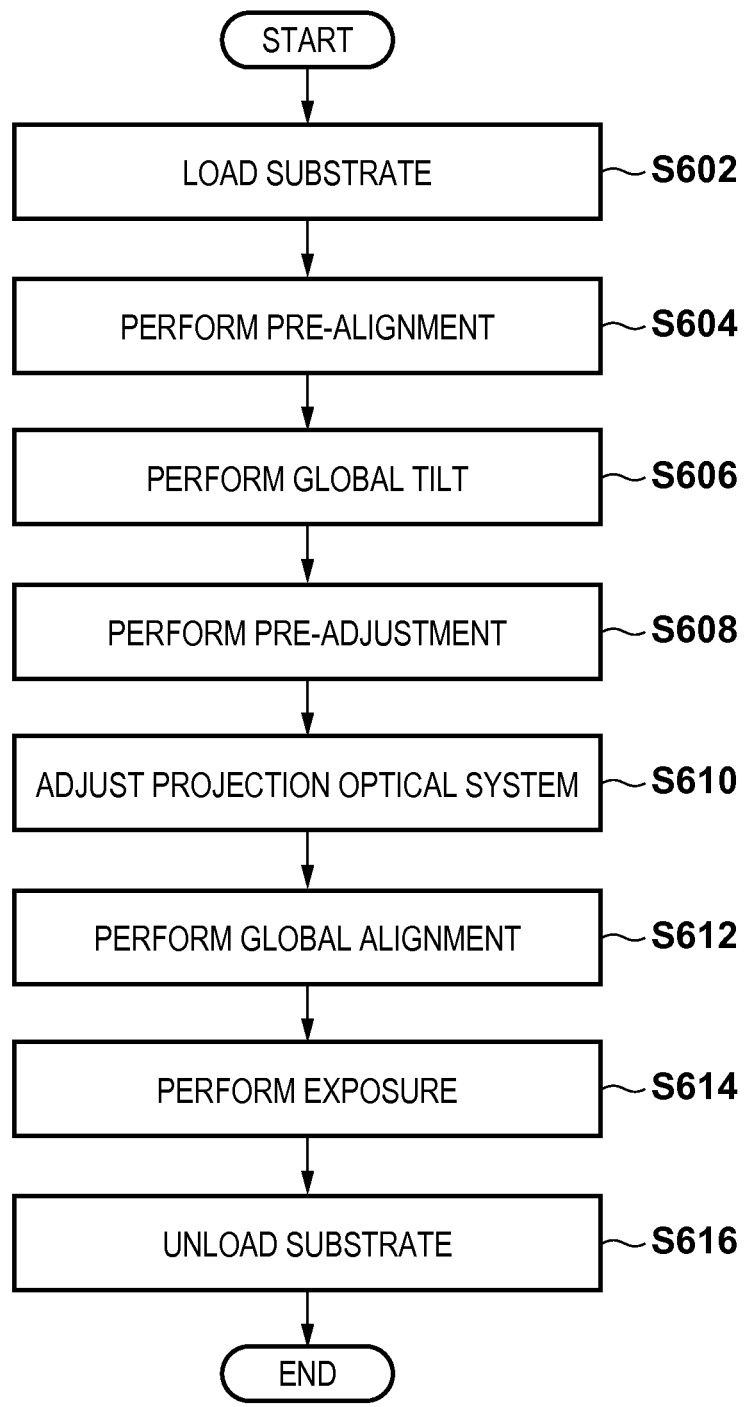
FIG. 6 is a flowchart for explaining the exposure process in the exposure apparatus shown in FIG. 1.

An operation in the exposure apparatus 100, that is, the exposure process will be explained with reference to FIG. 6. As described above, the exposure process is performed by exclusively controlling the respective units of the exposure apparatus 100 by the main control unit 127.

In step S602, the substrate 104 is loaded into the exposure apparatus 100. More specifically, the substrate 104 is transferred by a transfer hand (not shown) and held by the substrate stage 105.

In step S604, pre-alignment (pre-measurement and correction) for global alignment is performed. More specifically, the shift amount such as the rotation error of the substrate 104 is measured and corrected using a low-magnification field alignment microscope (not shown) so that an alignment mark on the substrate 104 falls within the measurement range of a high-magnification field alignment microscope (not shown) to be used in global alignment.

In step S606, global tilt is performed. More specifically, as shown in FIG. 7, the measurement unit MU measures the heights (surface positions) of sample shot regions SSR among a plurality of shot regions of the substrate 104. The global tilt of the substrate 104 is calculated and corrected based on the heights of the sample shot regions SSR measured by the measurement unit MU.

In step S608, pre-adjustment is performed for measurement of the height of the substrate 104 during exposure (during scanning of the mask stage 103 and substrate stage 105). Pre-adjustment includes adjustment of the light amount of the light source 110 of the measurement unit MU, and storage of a pattern step in the shot region of the substrate 104. By the technique disclosed in Japanese Patent Laid-Open No. 2011-238707 or the like, a correction value is obtained to correct a measurement error generated when a measurement target portion in the shot region of the substrate 104 is measured in the acceleration period of the substrate stage 105.

In step S610, the projection optical system 101 is adjusted. More specifically, the tilt of the projection optical system 101, the curvature of field, and the like are obtained using a light amount sensor and reference mark (neither is shown) arranged on the substrate stage 105, and a reference plate (not shown) arranged on the mask stage 103. For example, the light amount sensor arranged on the substrate stage 105 measures a change of the amount of exposure light when the substrate stage 105 is scanned in the X-, Y-, and Z-axis directions. The shift amount of the reference mark with respect to the reference plate is obtained based on the change of the amount of exposure light, and the projection optical system 101 is adjusted.

In step S612, global alignment is performed. More specifically, the alignment mark of the substrate 104 is measured using a high-magnification field alignment microscope, obtaining the shift amount of the overall substrate 104 and a shift amount common to respective shot regions. To measure the alignment mark at high accuracy, the alignment mark needs to exist at a position (best contrast position) at which the contrast of the alignment mark becomes best. Measurement of the best contrast position uses the measurement unit MU and an alignment microscope. For example, the substrate stage 105 is moved to a predetermined height (position in the Z-axis direction), the alignment microscope measures the contrast, and the measurement unit MU measures the height of the substrate 104. This process is repeated. At this time, a contrast measurement result corresponding to each position of the substrate stage 105 in the Z-axis direction and the measurement result of the height of the substrate 104 are saved in association with each other. Then, a position of the substrate stage 105 in the Z-axis direction where the contrast becomes highest is obtained based on a plurality of contrast measurement results and is defined as a best contrast position.

In step S614, the exposure target shot region of the substrate 104 is exposed. More specifically, the measurement unit MU measures the height of a measurement target portion in the exposure target shot region, and exposes the exposure target shot region while moving the substrate stage 105 to the optimum exposure position based on the measurement result. As described above, when the height of a measurement target portion is measured in the acceleration period of the substrate stage 105, the measurement result is corrected based on the correction value obtained in step S608. The measurement target portion measured in the acceleration period of the substrate stage 105 (that is, the same measurement target portion) is measured at a measurement point measurable in the constant speed period of the substrate stage 105. If the difference between the height of the measurement target portion measured in the constant speed period of the substrate stage 105 and the optimum exposure position exceeds the threshold, it is determined that the correction value is improper, and exposure of the exposure target shot region is stopped. For this shot region, a new correction value is obtained instead of the correction value obtained in step S608 according to the technique disclosed in Japanese Patent Laid-Open No. 2011-238707 or the like. After obtaining the new correction value, exposure of the exposure target shot region is executed again.

In step S616, the substrate 104 is unloaded from the exposure apparatus 100. More specifically, the exposed substrate 104 is received from the substrate stage 105 by the transfer hand (not shown), and transferred outside the exposure apparatus 100.

In the embodiment, if the difference between the height of a measurement target portion measured in the constant speed period of the substrate stage 105 and the optimum exposure position exceeds the threshold, exposure of the exposure target shot region is stopped, and a new correction value is obtained. However, when there are many shot regions for which the difference exceeds the threshold, if a new correction value is obtained every time the difference exceeds the threshold, the productivity of the exposure apparatus 100 may decrease. To prevent this, a shot region for which the difference exceeds the threshold may be stored, and after the end of exposing all shot regions, a new correction value may be obtained for the stored shot region.

Also, the substrate and a shot region for which the difference exceeds the threshold may be stored in association with each other, and when the difference exceeds the threshold in the same shot region on a plurality of substrates, a new correction value may be obtained for the stored shot region. In other words, the count at which the difference exceeds the threshold may be stored for each shot region, and when this count exceeds a predetermined value, a new correction value may be obtained.

The correction value for correcting a measurement error generated when a target measurement portion in the shot region of the substrate 104 is measured in the acceleration period of the substrate stage 105 is stored in, for example, a storage unit such as the memory of the main control unit 127. Every time the main control unit 127 obtains a new correction value, it updates the correction value stored in the storage unit to the new correction value.

In the embodiment, when the difference between the height of a measurement target portion measured in the constant speed period of the substrate stage 105 and the optimum exposure position exceeds the threshold, exposure of the exposure target shot region is stopped. However, instead of completely stopping exposure of the exposure target shot region, movement of the substrate stage 105 and measurement by the measurement unit MU may be continued, and a new correction value may be obtained based on the measurement result. In this case, movement of the substrate stage 105 and measurement by the measurement unit MU are performed under the same conditions as those used when this shot region is exposed, and the substrate 104 is not irradiated with exposure light. A new correction value Comp can be calculated by:

$$\text{Comp} = (Foc2 - Foc1) - (Stg2 - Stg1) \tag{1}$$

where $Foc1$ and $Foc2$ are the measurement results of the height of a measurement target portion, and $Stg1$ and $Stg2$ are positions of the substrate stage 105 in the Z-axis direction when the height of the measurement target portion is measured. Note that the measurement target portions of $Foc1$ and $Foc2$ are the same.

When equation (1) is applied to the state shown in FIG. 5A, $Foc1$ corresponds to a result obtained by removing the correction value from the correction result PL1 at time t5. $Foc2$ corresponds to the measurement result PL4 at time t6. $Stg1$ corresponds to a position of the substrate stage 105 in the Z-axis direction at time t5. $Stg2$ corresponds to a position of the substrate stage 105 in the Z-axis direction at time t6.

In this manner, a new correction value can be obtained based on the height of a measurement target portion measured during exposure and a position of the substrate stage 105 in the Z-axis direction (direction of height of the substrate 104). Therefore, the substrate stage 105 need not be moved separately for the purpose of obtaining a new correction value, and the productivity of the exposure apparatus 100 can be increased.

When the difference between the height of a measurement target portion measured in the constant speed period of the substrate stage 105 and the optimum exposure position exceeds the threshold, exposure of the exposure target shot region may be continued without stopping it, and a new correction value may be obtained by equation (1) described above. When the correction value is obtained for each shot region, an appropriate correction value is reflected for a substrate to be exposed next. The exposure target shot region of a currently exposed substrate is thus defocused and exposed. For this reason, the threshold is preferably set to a value at which a resolution error by defocus is not generated.

The exposure apparatus 100 according to the embodiment can shorten the time taken to obtain a correction value for correcting a measurement error generated when a target measurement portion in the shot region of the substrate 104 is measured in the acceleration period of the substrate stage 105. Hence, the exposure apparatus 100 can increase the productivity. The exposure apparatus 100 can provide an economical high-quality device (for example, a semiconductor device, liquid crystal display device, or flat panel display (FPD)) at high throughput. Such a device is fabricated through a step of exposing a substrate (for example, a wafer or glass plate) coated with a photoresist (photosensitive agent) by using the exposure apparatus 100, a step of developing the exposed substrate, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-033869 filed on Feb. 22, 2013, which is hereby incorporated by reference herein in its entirety.

What is claimed is:

1. An exposure apparatus which transfers a pattern of a mask to a substrate while scanning the mask and the substrate, comprising:
 a stage configured to hold the substrate and move;
 a measurement unit configured to measure, at a first measurement point and a second measurement point, a height of a measurement target portion in a shot region of the substrate held by the stage; and
 a control unit configured to control an exposure process of exposing the substrate in an exposure region,
 wherein a period in which the stage is moved to expose one shot region of the substrate includes an acceleration period in which the stage is accelerated and moved while the one shot region is brought close to the exposure region, and a constant speed period, succeeding the acceleration period, in which the stage is moved at a constant speed, and
 the control unit moves the stage in a direction of height of the substrate based on a correction result of correcting, by a set correction value, a height of the measurement target portion that was measured by the measurement unit at the first measurement point in the acceleration period, and when a height of the measurement target portion that was measured by the measurement unit at the second measurement point in the constant speed period deviates from an allowable range, obtains a new correction value instead of the set correction value.

2. The apparatus according to claim 1, wherein when a difference between the height of the measurement target portion that was measured by the measurement unit at the second measurement point in the constant speed period, and a height of an imaging plane of the pattern of the mask exceeds a threshold, the control unit obtains the new correction value.

3. The apparatus according to claim 2, wherein the threshold is determined based on at least one of a speed of the stage in the constant speed period or a depth of focus of the substrate held by the stage.

4. The apparatus according to claim 1, wherein the control unit obtains the new correction value based on the height of the measurement target portion that was measured by the measurement unit at the second measurement point in the constant speed period, and a position of the stage in the direction of height of the substrate when the height of the measurement target portion was measured at the second measurement point.

5. The apparatus according to claim 2, wherein when a count at which the difference exceeds the threshold exceeds a predetermined value, the control unit obtains the new correction value.

6. The apparatus according to claim 2, wherein the control unit stops transfer of the pattern of the mask to a shot region in which the difference exceeds the threshold, out of shot regions of the substrate.

7. The apparatus according to claim 2, further comprising a storage unit configured to store the correction value, wherein every time the control unit obtains the new correction value, the control unit updates the correction value stored in the storage unit to the new correction value.

8. An exposure method of transferring a pattern of a mask to a substrate while scanning the mask and the substrate, comprising a step of controlling an exposure process of exposing the substrate in an exposure region,
 wherein a period in which a stage configured to hold the substrate is moved to expose one shot region of the substrate includes an acceleration period in which the stage is accelerated and moved while the one shot region is brought close to the exposure region, and a constant speed period, succeeding the acceleration period, in which the stage is moved at a constant speed, and
 in the step, the stage is moved in a direction of height of the substrate based on a correction result of correcting, by a set correction value, a height of a measurement target portion in a shot region of the substrate that was measured in the acceleration period, and when a height of the measurement target portion that was measured in the constant speed period deviates from an allowable range, a new correction value is obtained instead of the set correction value.

9. A device fabrication method comprising steps of:
 exposing a substrate using an exposure apparatus; and
 performing a development process for the substrate exposed,
 wherein the exposure apparatus which transfers a pattern of a mask to the substrate while scanning the mask and the substrate and includes:
 a stage configured to hold the substrate and move;
 a measurement unit configured to measure, at a first measurement point and a second measurement point, a height of a measurement target portion in a shot region of the substrate held by the stage; and
 a control unit configured to control an exposure process of exposing the substrate in an exposure region,
 wherein a period in which the stage is moved to expose one shot region of the substrate includes an acceleration period in which the stage is accelerated and moved while the one shot region is brought close to the exposure region, and a constant speed period, succeeding the acceleration period, in which the stage is moved at a constant speed, and
 the control unit moves the stage in a direction of height of the substrate based on a correction result of correcting, by a set correction value, a height of the measurement target portion that was measured by the measurement unit at the first measurement point in the acceleration period, and when a height of the measurement target portion that was measured by the measurement unit at the second measurement point in the constant speed period deviates from an allowable range, obtains a new correction value instead of the set correction value.

* * * * *